United States Patent [19]
Aoki et al.

[11] Patent Number: 5,909,473
[45] Date of Patent: Jun. 1, 1999

[54] BIT SYNCHRONIZING CIRCUIT

[75] Inventors: Yasushi Aoki; Mitsuo Baba; Atsushi Katayama, all of Tokyo, Japan

[73] Assignee: NEC Corporation, Tokyo, Japan

[21] Appl. No.: 08/806,480

[22] Filed: Feb. 27, 1997

[30] Foreign Application Priority Data

Feb. 27, 1996  [JP]  Japan .................................. 8-039329

[51] Int. Cl.⁶ .................................................. H03D 3/24
[52] U.S. Cl. .......................... 375/373; 375/355; 375/354; 370/503
[58] Field of Search .................... 375/373, 355, 375/354, 371; 370/503, 516, 518; 327/141; 371/1

[56] References Cited

U.S. PATENT DOCUMENTS

| | | | |
|---|---|---|---|
| 4,841,551 | 6/1989 | Avaneas ................................... | 375/373 |
| 5,022,057 | 6/1991 | Nishi et al. ............................. | 375/373 |
| 5,034,967 | 7/1991 | Cox et al. ............................... | 375/373 |
| 5,052,026 | 9/1991 | Walley .................................... | 375/373 |
| 5,185,768 | 2/1993 | Ferraiolo et al. ....................... | 375/373 |
| 5,294,844 | 3/1994 | Motoike ................................. | 307/352 |
| 5,432,823 | 7/1995 | Gasboro et al. ........................ | 375/371 |
| 5,533,072 | 7/1996 | Georgiou et al. ....................... | 375/371 |
| 5,638,411 | 6/1997 | Oikawa .................................. | 375/372 |
| 5,642,387 | 6/1997 | Fukasawa ............................... | 375/37 |
| 5,657,318 | 8/1997 | Ohmori et al. ......................... | 370/516 |

FOREIGN PATENT DOCUMENTS

62-43919  2/1987  Japan .

*Primary Examiner*—Chi H. Pham
*Assistant Examiner*—Emmanuel Bayard
*Attorney, Agent, or Firm*—Scully, Scott Murphy & Presser

[57]  ABSTRACT

In a bit synchronizing circuit, the oscillating operation is prevented in the phase synchronizing stage such that even the reception data including a phase variation such as a jitter component can be appropriately reproduced. A phase comparator compares the phase of reception data with that of each of the n-phase clock signals to produce clock phase information. An averaging circuit obtains mean value data of the clock phase information. D-type flip flop circuits achieve sampling operations of the reception data and latch therein n sampling data items to be thereafter outputted. A data selector selects one of the n sampling data items according to the mean value data of clock phase information and delivers therefrom the selected item as selection data. A clock selector selects one of the n-phase clock signals in association with the average data of clock phase information and then outputs the selected item as an extraction clock signal.

14 Claims, 6 Drawing Sheets

BIT SYNCHRONIZING CIRCUIT

BACKGROUND OF THE INVENTION

The present invention relates to a bit synchronizing circuit, and in particular, to a bit synchronizing circuit in winch a comparison of phase is conducted between reception data and a polyphase clock signal to establish synchronization with respect to phase according to a result of the phase comparison.

DESCRIPTION OF THE PRIOR ART

Recently, digital transmission technologies have been amazingly developed. In the digital transmission, there is employed a bit synchronizing technology adopted on a receiving side to extract and to reproduce a digital signal sent from a communicating partner.

In the transmitting facilities utilized in the space communication field as well as the integrated services digital network (ISDN), it is required to appropriately receive a digital signal having a phase variation or fluctuation.

In general, a digital phase-locked loop (DPLL) circuit operating with a polyphase clock signal is used as a bit synchronizing circuit when communicating digital signals between a plurality of apparatuses operating with a clock Signal supplied from one identical clock source, namely, operating in a phase synchronous state in which the phases are synchronized with each other.

An example of the bit synchronizing technology has been described in the Japanese Patent Laid-Open Publication No. 62-3919 entitled "PLL Circuit Using Polyphase Clock".

Figure 1:
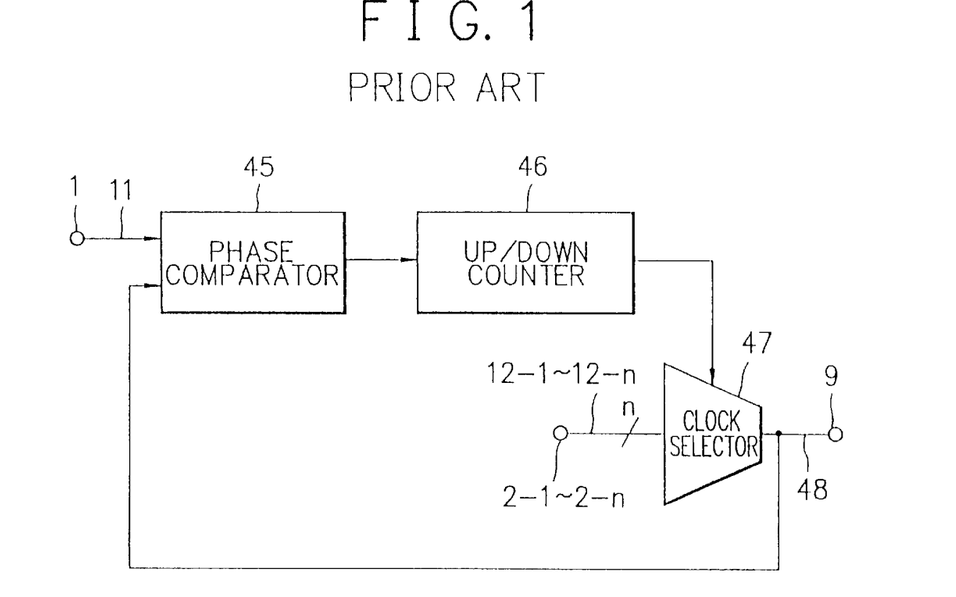
FIG. 1 is a schematic block diagram showing the construction of a bit synchronizing circuit of the conventional technology.

FIG. 1 shows in a block diagram the configuration of a conventional bit synchronizing circuit.

The bit synchronizing circuit includes an input terminal 1 for receiving reception data 11, a phase comparator circuit 45 for comparing the phase of the reception data 11 with that of an extraction clock signal 48, an up and down (up/down) counter 46 for counting phase comparison signals outputted from the phase comparator circuit 45, clock input terminals 2-1 to 2-n for receiving n-phase clock signals 12-1 to 12-n, a clock selector 47 for selecting either one of the n-phase clock signals 12-1 to 12-n, and a clock output terminal 9 for delivering therefrom the extraction clock signal 48 chosen by the clock selector 47.

Operation of the bit synchronization circuit will be next described by referring to FIG. 1.

The clock selector 47 is supplied with the n-phase click signals 12-1 to 12-N which each have a frequency substantially equal to that of the reception data 11 and which are shifted in phase from each other 360°/n (n is an integer equal to or more than two). The clock selector 47 selects one of the n-phase clock signals 12-1 to 12-n according to the count value from the up/down counter 46 to supply the obtained signal as an extraction clock signal 48 to the clock output terminal 9.

The phase comparing circuit 45 compares the phase of the reception data 11 with that of the extraction clock signal 48 and then feeds a phase comparison signal resultant from the comparison to the up/down counter 46. In response to the comparison result, the up/down counter 46 increments or decrements the count value to thereby control the selecting operation of the clock selector 47.

Repeating the sequence of operation steps above, there is produced an extraction clock signal 48 synchronized in phase with respect to the reception data 11.

In the bit synchronizing circuit of the prior art, the extracted clock signal is supplied again to the phase comparator circuit. Therefore, when the propagation delay time of the phase control signal, namely, the period of time in which the phase comparison signal designating the result of phase comparison propagates to the clock selector 47 exceeds the time of one cycle in which the phase comparison is accomplished, there arises a disadvantage that the phase synchronizing operation results in other than conversion, namely, a state of oscillation takes place.

Furthermore, when the reception data includes a phase fluctuation of a short cycle such as a jitter, the phase of the extraction clock is varied in correspondence with the phase fluctuation of the reception data. This consequently leads to a disadvantage that the phase synchronization is lost between the reception data and the extraction clock signal due to the variation in time of the propagation delay time.

SUMMARY OF THE INVENTION

It is therefore an object of the present invention to provide a bit synchronizing circuit in which the phase synchronization is carried out without using the feedback loop structure causing the oscillation to produce an extraction clock signal synchronized in phase with reception data having a phase fluctuation such as a jitter component and to obtain extraction data free of a retiming error.

In accordance with the present invention, there is provided a bit synchronizing circuit including sampling means for latching therein reception data according to n kinds of polyphase clock signals (n is an integer equal to or more than two) and thereby producing n sampling data items, phase comparing means for attaining clock phase information indicating a polyphase clock signal from the n kinds of polyphase clock signals, the polyphase clock signal having a phase difference substantially nearest to 180° relative to a phase of the reception data; averaging means for calculating a mean value of the clock phase information outputted from the phase comparing means, data selecting means for selecting one of the n sampling data items in response to a selection signal supplied from the averaging means, the selected sampling data item being indicated by the clock phase information; and clock selecting means for selecting in response to the selection signal the polyphase clock signal indicated by the clock phase information.

Moreover, in accordance with the present invention, there is provided a bit synchronizing circuit including sampling means for latching therein reception data according to n kinds of polyphase clock signals (n is an integer equal to or more than two) and thereby producing n sampling data items, the polyphase clock signals having a frequency substantially equal to a frequency of the reception data, the polyphase clock signals sequentially having therebetween a delay of 360°/n in phase, phase comparing means for receiving as inputs thereto the reception data and the n kinds of polyphase clock signals and attaining clock phase information indicating a polyphase clock signal from the n kinds of polyphase clock signals, the polyphase clock signal having a phase difference substantially nearest to 180° relative to a phase of the reception data at a change point thereof; averaging means for calculating a mean value in time series of the clock phase information outputted from the phase comparing means, data selecting means for selecting one of the n sampling data items in response to a selection signal supplied from the averaging means, the selected sampling data item being indicated by the clock phase information; and clock selecting means for selecting in response to the selection signal one of the n kinds of polyphase clock signals, the selected signal being indicated by the clock phase information.

Additionally, in accordance with the present invention, the phase comparing means includes n latch means for respectively latching therein n kinds of polyphase clock signals using a rising or falling edge of the reception data and an encoder for producing the clock phase information according to n latch output delivered respectively from the n latch means.

Furthermore, in accordance with the present invention, the averaging means includes a subtracter for conducting a subtracting operation between the clock phase information and memory information, a weighting section for weighting a result of subtraction outputted from the subtracter, an adder for adding weighting information from the weighting section to the memory information, a memory section for storing the memory information of addition from the adder at a timing associated with the reception data, and arithmetic section for rounding the memory information from the memory section in which fractions of five or over are counted as a unit and the rest is disregarded.

Additionally, in accordance with the present invention, the sampling means includes D-type flip flop circuits.

Moreover the latch means in accordance with the present invention includes D-type flip flop circuits.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring now to the accompanying drawings, description will be given of an embodiment of the bit synchronizing circuit in accordance with the present invention.

Figure 2:
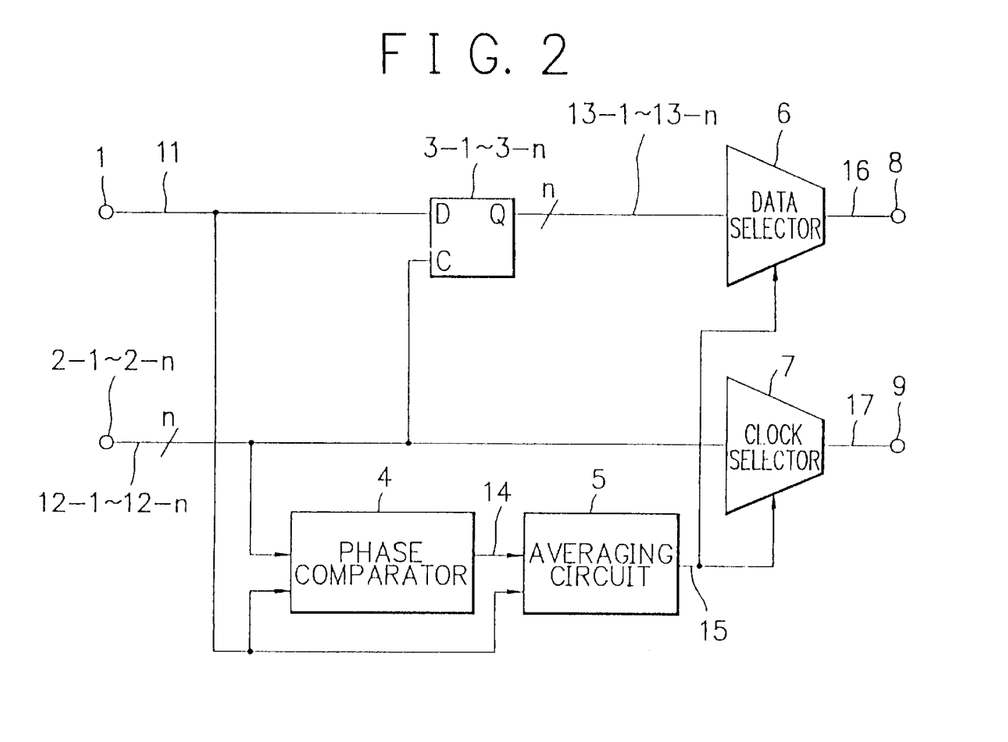
FIG. 2 is a block diagram schematically showing an embodiment of the bit synchronizing circuit in accordance with the present invention.

FIG. 2 shows in a block diagram the configuration of an embodiment of the bit synchronizing circuit in accordance with the present invention.

The configuration of the embodiment shown in FIG. 2 includes an input terminal 1 for receiving reception data 11, clock input terminals 2-1 to 2-n for receiving n-phase clock signals 12-1 to 12-n, a phase comparator circuit 4 for comparing the phase of the reception data 11 with that of each of the n-phase clock signals 12-1 to 12-n, an averaging circuit 5 for producing mean value data 15 according to the reception data 11 and clock phase information 14 supplied from the phase comparator 4, D-type flip flop circuits 3-1 to 3-n for latching and keeping therein the reception data 11 respectively in response to the n-phase clock signals 12-1 to 12-n, a data selector 6 for selecting a data item sampled, in response to a clock signal corresponding to the mean value data 15, from the sampling data items 13-1 to 13-n outputted from the respective D-type flip flop circuits 3-1 to 3-n, a data output terminal 8 for outputting therefrom selection data 16 chosen by the data selector 6, a clock selector 7 for selecting one of the n-phase clock signals 12-1 to 12-n in association with the mean value data 15, and a clock output terminal 9 for outputting therefrom an extraction clock signal 17 selected by the clock selector 7.

In FIG. 2, the same constituent components as those of FIG. 1 are assigned with the same reference numerals or symbols and hence description thereof will be unnecessary.

Next, operation of the embodiment of the bit synchronization circuit will be described in detail.

The reception data 11 received via the data input terminal 1 is fed to a data input terminal D of each of the D-type flip flop circuits 3-1 to 3-n (n is an integer equal to or more than two). Respectively supplied to clock input terminals C of the respective flip flop circuits 3-1 to 3-n are the n-phase clock signals 12-1 to 12-n. In response to these clock signals, the reception data 11 is sampled such that n sampling data items 13-1 to 13-n are latched therein so as to be outputted therefrom.

The n-phase clock signals mean in this context have a frequency substantially equal to the frequency of the reception data 11 and phases having a phase difference of 360°/n sequentially therebetween.

The phase comparator 4 compares a rising edge of the reception data 11 with a rising edge of each of the n-phase clock signals 12-1 to 12-n to extract therefrom an extraction clock having a phase difference of about 180° with respect to the phase of the reception data 11 at a change point and then supplies the averaging circuit 5 with clock phase information 14 denoting a number assigned to the extraction clock.

The averaging circuit 5 calculates a mean value of the clock phase information signal 14 in a range from a point in the past to the current point to produce mean value data 15.

The data selector 6 selects one of the n sampling data items 13-1 to 13-n through a sampling operation according to the extraction clock signal corresponding to the mean value data 15 of the clock phase information 14 and then sends the sampling data item as selection data 16 to the data output terminal 8.

The clock selector 7 selects from the n-phase clock signals 12-1 to 12-n an extraction clock signal corresponding to the mean value data 15 of the clock phase information 14, thereby delivering the selected signal as an extraction clock signal 17 to the clock output terminal 9.

Figure 3:
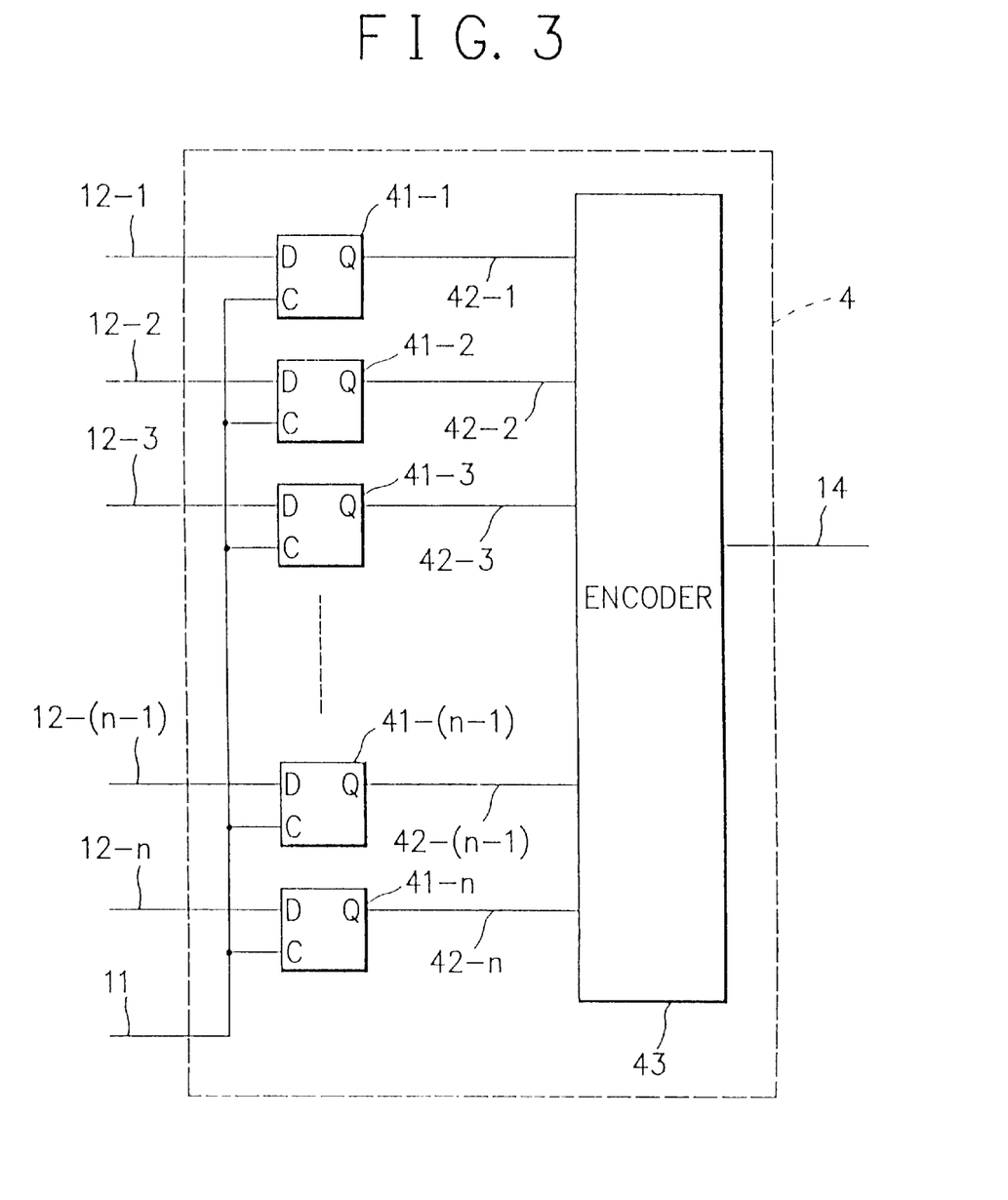
FIG. 3 is a detailed block diagram showing an example of a phase comparator circuit.

FIG. 3 is a detailed block diagram showing an example of the phase comparing circuit of FIG. 2.

As shown in FIG. 3, the n-phase clock signals 12-1 12-n are respectively supplied to the data input (D) terminals respectively of the n D-type flip flop circuits 41-1 to 41-n, and reception data 11 is commonly fed to the clock input (C) terminals thereof. At timing synchronized with a rising edge of the reception data 11, the n-phase clock signals 12-1 to 12-n are latched in the respective flip flop circuits 41-1 to 41-n to be outputted as latch output signals 42-1 to 42-n to the encoder 43.

In response to the latch output signals 42-1 to 42-n, the encoder 43 encodes clock numbers "1" to "n" respectively assigned to the clock signals 12-1 to 12-n each having a phase difference of about 180° relative to the phase of the change point of reception data 11, thereby producing the encoded result as clock phase information 14.

Figure 4:
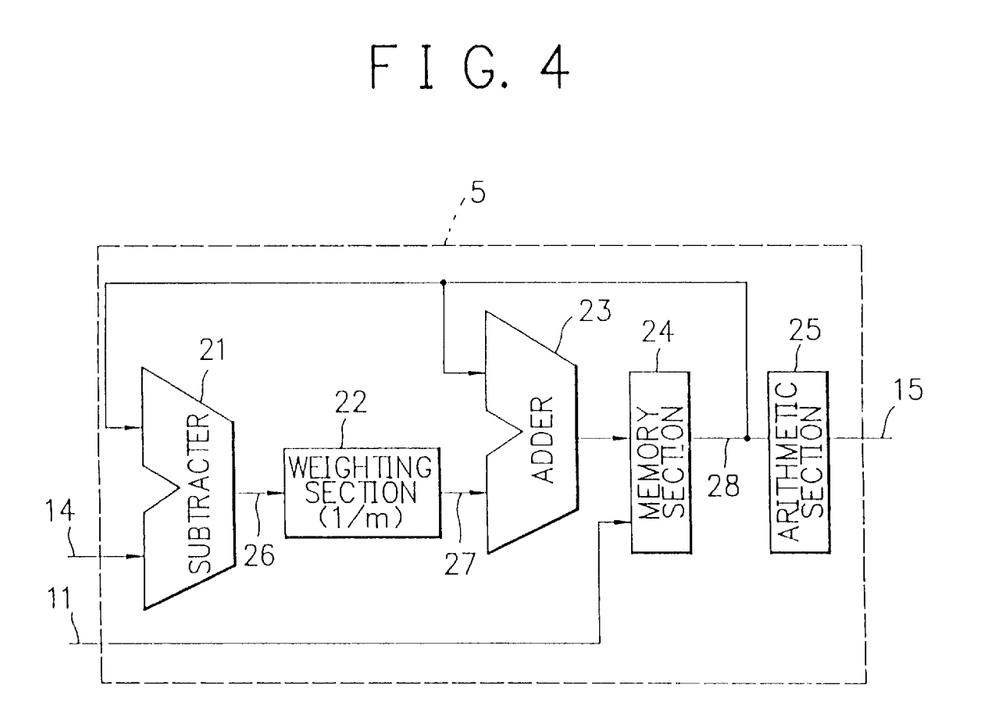
FIG. 4 is a block diagram showing in detail structure of an averaging circuit.

FIG. 4 shows in a detailed block diagram an example of the averaging circuit of FIG. 2.

In the structure of FIG. 4, the clock phase information 14 fed from the phase comparator 4 is inputted to a subtracter 21. In this regard, the reception data 11 is delivered to a memory 24, which on the other hand keeps therein the result of addition sent from the adder 23 and transmits the value thereof as a storage output 28 to the arithmetic section 25. In the subtracter 21, the memory output 28 is subtracted from the clock phase information 14 to feed the result of subtraction 26 to a weighting section 22. In the weighting section 22, the subtraction output 26 is divided by m (integer) to output a weighted output 27 resultant from the division to an adder 23.

In the adder 23, the weighted output 27 is added to the memory output 28 such that a corrected mean value obtained using the memory output 28 is stored in the memory 24.

In the arithmetic section 25, the memory output 28 from the memory 24 is rounded, i.e., fractions of five and over are counted as a unit and the rest is disregarded, thereby producing mean value data 15 of the clock phase information.

Referring now to signal timing charts, description will be given in detail of an example using 8-phase clock signals (n=8) and the weighting coefficient set to four (m=4) in the weighting section 22.

Figure 5:
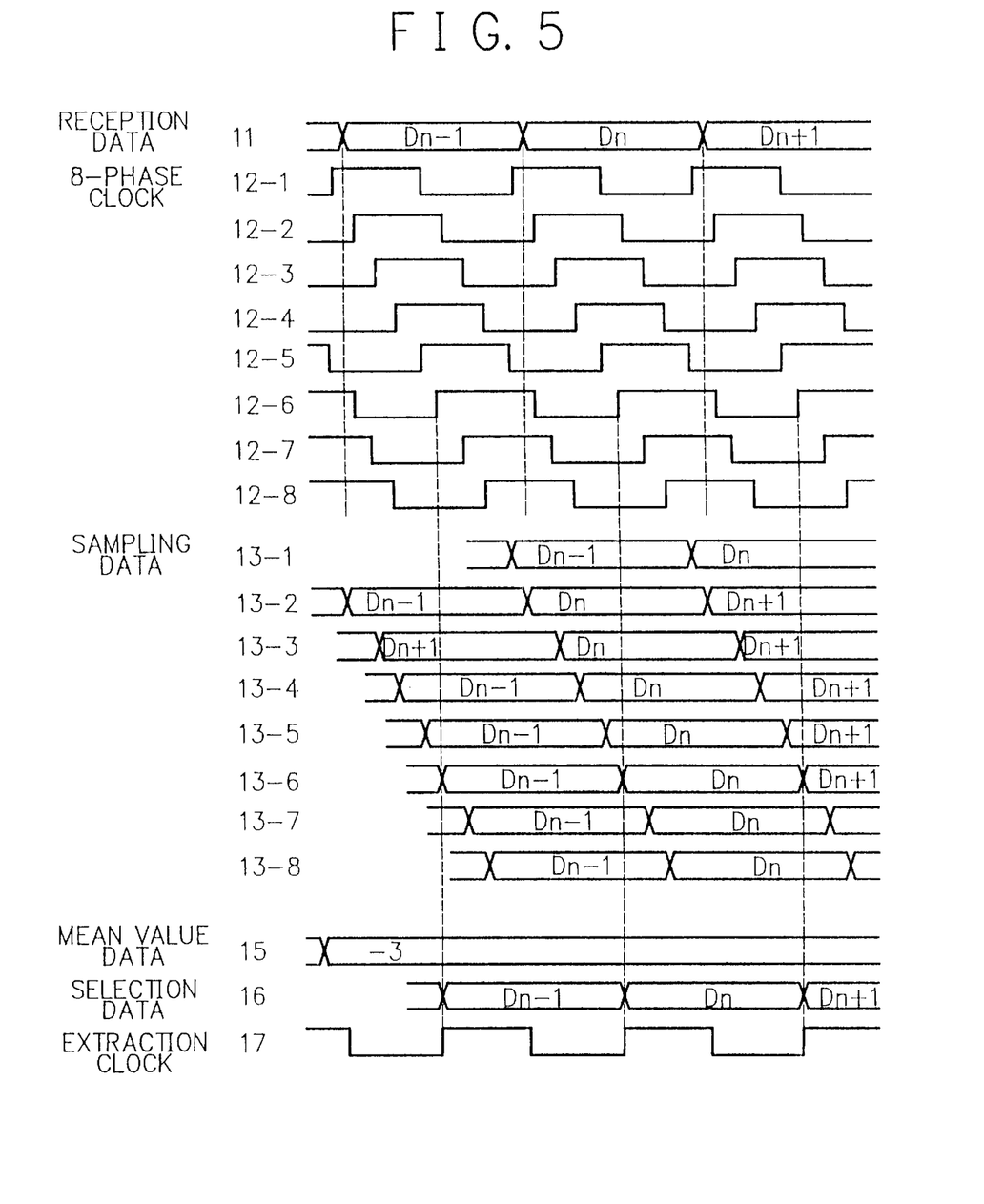
FIG. 5 is a signal timing chart for explaining operation of the embodiment of FIG. 2.

FIG. 5 is a signal timing chart showing operation of the configuration shown in FIG. 2.

According to this timing chart showing a relationship between phases, when the phase of reception data 11 at a change point is substantially synchronized with the clock signal 12-2 selected from the 8-phase clock signals 12-1 to 12-8, the data selectors 6 and 7 respectively choose selection data 16 and an extraction clock signal 17 corresponding to the clock signal 2-6.

Additionally, through operations of the phase comparator 4 and the averaging circuit 5, there is attained clock phase information 14 ("−3") indicating the clock number of a clock signal allowing the maximum phase margin in the retiming of the reception data 11, namely, the clock number (related to the 8-phase clock signal 12-6) having a phase difference of about 180° relative to the phase of reception data 11 at the change point.

That is, the rising edge of the clock signal 12-6 is at substantially an intermediate point of the reception data, which hence leads to a sufficient phase margin and a stable operation.

As a result of the retiming and latching operations according to the clock signal 1-6 designated by the clock phase information 14 ("3"), sampling data 13-6 is selected as selection data 16 by the data selector 6.

Furthermore, the retimed clock signal 12-6 is also selected as an extraction clock signal 17 by the clock selector 7.

Figure 6:
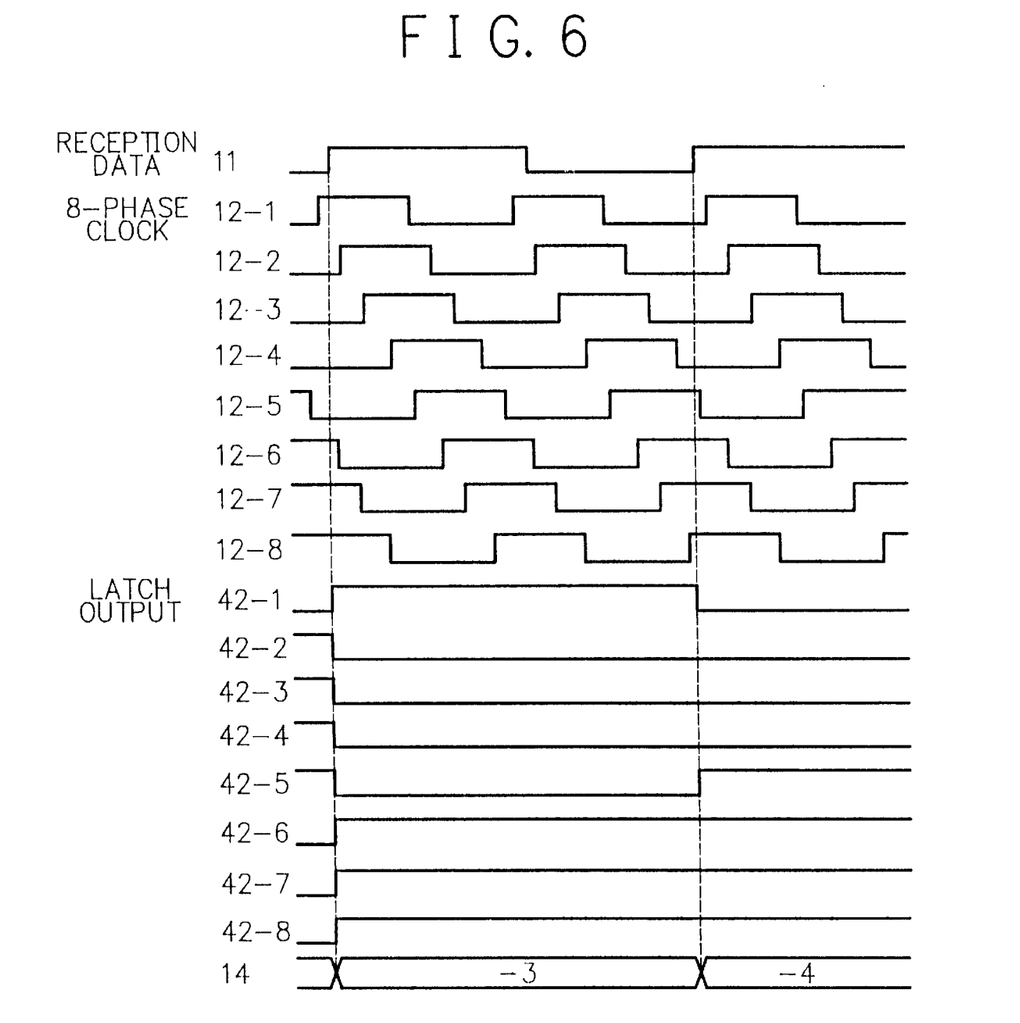
FIG. 6 is a signal timing chart showing operation of the phase comparing circuit of FIG. 3.

FIG. 6 shows in a signal timing chart the operation of the phase comparator of FIG. 3.

As can be seen from FIGS. 3 and 6, when the 8-phase clock signals 12-1 to 12-8 supplied respectively to the D-type type flip flop circuits 41-1 to 41-8 are latched respectively therein at a timing of the rising edge of reception data 11, there are attained latch outputs 42-1 to 42-8. These output signals 42-1 to 42-8 are encoded by the encoder 43 into clock phase information 14 ("3") denoting a clock number (associated with the clock signal 12-6) having a phase difference of about 180° relative to the phase of reception data 11 at the change point.

Table 1 shows the encoding logic of the encoder 43. t,130

The value of clock phase information 14 sent from the encoder 43 is represented by three bits ranging from "000" to "111". For these values, there is beforehand established a one to-one correspondence with eight kinds of clock signals 12-1 to 12-8.

As shown in FIG. 6, when the rising edge of the reception data 11 is between the rising edges respectively of the clock signals 12-1 and 12-2, it can be readily appreciated that the value represented by latch outputs 42-1 to 42-8 is "10000111" in which "1" and "0" respectively stand for a high level and a low level of the signal.

On the basis of Table 1, the latch output "10000111" is elated to a value of "−3" for the clock phase information 14. Namely, the 3-bit notation (101) specifies the sixth clock signal, i.e., clock signal 12-6.

In addition, when the rising edge of the reception data 11 exists at an intermediate point between the rising edges respectively of the clock signals 12-8 and 12-1, the value denoted by latch outputs 42-1 to 42-8 is "00001111". According to Table 1, the latch output "00001111" is associated with a value of "−4" for the clock phase information 14. Therefore, the 3-bit representation (101) designates the fifth clock signal, i.e., clock signal 12-5.

Figure 7:
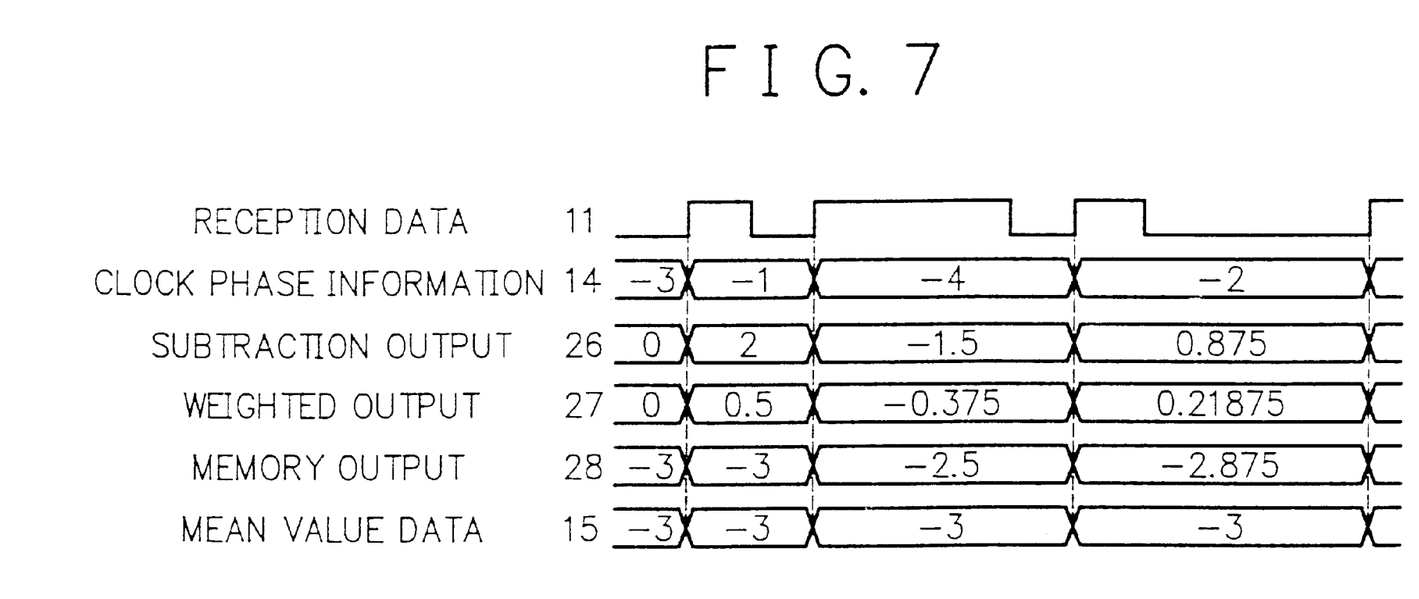
FIG. 7 is a signal timing chart for explaining operation of the averaging circuit of FIG. 4.

FIG. 7 is a signal timing chart showing operation of the averaging circuit of FIG. 4.

Referring now to FIG. 7, there is shown an internal state of the averaging circuit 5 when the reception data 11 and the clock phase information 14 from the phase comparator 4 are applied thereto.

As shown in FIG. 4, there is produced a difference between the clock phase information 14 and the memory output 28 obtained from the memory 24 such that the result of subtraction is outputted therefrom as a subtraction output 26.

The output signal 26 is weighted or divided by four and the result of division is fed as a weighted output 27 to the adder 23. In the adder 23, the memory output 28 from the memory 24 is added to the weighted output 27 and then the result of addition is stored in the memory 24 each time a rising edge of the reception data 11 is detected. As a result of the operation, there is obtained a mean value of the values of clock phase information 14 ranging from a point in the past to the latest point. The mean value is then stored in the memory 24. In the arithmetic section 25, the averaged value 28 outputted from the memory 24 is rounded, namely, fractions of five and over are counted as a unit and the rest is disregarded. The resultant data is outputted therefrom as mean value data 15.

For example, when the clock phase information 14 is "−1" and the memory output 28 is "−3", the subtraction output 26 takes a value of "2" (=1−(−3)). Since the weighting factor is set to ¼, the weighted output 27 is "0.5" (=²⁄₄).

In the adder 23, the value "0.5" of weighted output 27 is added to the value "−3" of memory output 28 such that the result of addition "−2.5" (=0.5+(−3)) is stored in the memory 24.

The value "−2.5" of the averaged memory output 28 from the memory 24 is then rounded as above by the arithmetic unit 25 so as to produce the value "−3" of mean value data.

When the value of clock phase information 14 is then set to "−4", since the value of memory output 28 is "−2.5" as a result of the preceding operation, the value of subtraction output 26 is "−1.5" (=−4−(−2.5)). Since the weighting coefficient is ¼, the weighted output 27 takes a value of "−0.375" (=−1.5:¾)).

In the adder 23, the value "−0.375" of weighted output 27 is added to the value "−2.5" of memory output 28 to stores the resultant value "−2.875" (=−0.375+(−2.5)) in the memory 24.

The value "−2.875" of memory output 28 from the memory 24 is then rounded by the arithmetic unit 25. As a result, there is obtained the value "−3" of mean value data 15.

After the operation above, when the clock phase information 14 takes a value of "−2", since the value of memory output 28 is "−2.875" as described above, the value of subtraction output 26 is attained as "0.875" (=−2−(−2.875)). According to the weighting coefficient set to ¼, the value of weighted output 27 is calculated as $^{8.875}\!/_{4}$=0.21875.

Adding the value "0.21875" of weighted output 27 to the value "−2.875" of memory output 28, the adder 23 stores the resultant value "−2.65625" (=0.21875+(−2.875)) in the memory 24.

In the arithmetic unit 25, the value "−2.65625" of averaged memory output 28 from the memory 24 is rounded as above into the value "−3" of means value data 15.

In this connection, the phase comparing circuit 4 and averaging circuit 5 are not limited to the configurations above. That is, these circuits may include other circuit constructions, a microprocessor, or a microcomputer including a memory and peripheral circuits.

As above, in accordance with the bit synchronizing circuit of the present invention, the phase synchronization is established using the result of comparison in phase between the reception data and the polyphase clock signal. Consequently, the feedback loop for the extraction clock signal can be dispensed with. This leads to an advantage that the oscillation can be prevented in the phase synchronizing operation.

Moreover, for the values of clock phase information indicating the phase comparison results, a mean value is calculated in a range from a point in the past to the current point. Using the mean value data, an extraction clock signal can be obtained from polyphase clock signals and a selected reception data item can be utilized. Resultantly, even when the reception data is associated with a phase fluctuation such as a jitter component, there can be obtained advantageous effect that an extraction clock is produced with an appropriate phase synchronization and the reception data is attained without any retiming error.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A bit synchronizing circuit, comprising:

sampling means for latching therein reception data according to n kinds of polyphase clock signals (n is an integer equal to or more than two) and thereby producing n sampling data items;

phase comparing means for comparing a phase of the reception data with that of each of the n kinds of polyphase clock signals for attaining clock phase information indicating a polyphase clock signal from the n kinds of polyphase clock signals, the indicated polyphase clock signal having a phase difference substantially nearest to 180° relative to a phase of the reception data;

averaging means for calculating a mean value of the clock phase information outputted from the phase comparing means;

data selecting means for selecting one of the n sampling data items in response to a selection signal supplied from the averaging means, the selected sampling data item being indicated by the clock phase information; and clock selecting means for selecting in response to the selection signal the polyphase clock signal indicated by the clock phase information.

2. A bit synchronizing circuit, comprising:

sampling means for latching therein reception data according to n kinds of polyphase clock signals (n is an integer equal to or more than two) and thereby producing n sampling data items, the polyphase clock signals having a frequency substantially equal to a frequency of the reception data, the polyphase clock signals sequentially having therebetween a delay of 360°/n in phase;

phase comparing means for receiving as inputs thereto the reception data and the n kinds of polyphase clock signals for comparing a phase of the reception data with that of each of the n kinds of polyphase clock signals for attaining clock phase information indicating a polyphase clock signal from the n kinds of polyphase clock signals, the polyphase clock signal having a phase difference substantially nearest to 180° relative to a phase of the reception data at a change point thereof;

averaging means for calculating a mean value in time series of the clock phase information outputted from the phase comparing means;

data selecting means for selecting one of the n sampling data items in response to a selection signal supplied from the averaging means, the selected sampling data item being indicated by the clock phase information; and clock selecting means for selecting in response to the selection signal one of the n kinds of polyphase clock signals, the selected signal being indicated by the clock phase information.

3. A bit synchronizing circuit in accordance with claim 1, wherein the phase comparing means includes:

n latch means for respectively latching therein n kind of polyphase clock signals using a rising or falling edge of the reception data and an encoder for producing the clock phase information according to n latch output delivered respectively from the n latch means.

4. A bit synchronizing circuit in accordance with claim 1, wherein the averaging means includes:

a subtracter for conducting a subtracting operation between the clock phase information and memory information;

a weighting section for weighting a result of subtraction outputted from the subtracter;

an adder for adding weighting information from the weighting section to the memory information;

a memory section for storing therein information of addition from the adder at a timing associated with the reception data; and arithmetic section for rounding the memory information from the memory section in which fractions of five or over are counted as a unit and the rest is disregarded.

5. A bit synchronizing circuit in accordance with claim 1, wherein the sampling means includes D-type flip flop circuits.

6. A bit synchronizing circuit in accordance with claim 3, wherein the latch means includes D-type flip flop circuits.

7. A bit synchronizing circuit in accordance with claim 1, wherein the averaging means calculates a mean value in time of the clock phase information from past to current values in time of the clock phase information.

8. A bit synchronizing circuit in accordance with claim 1, wherein the sampling means includes D-type flip flop circuits having the reception data directed to data input terminals of the D-type flip flop circuits and the n kinds of polyphase signals directed to clock input terminals of the D-type flip flop circuits.

9. A bit synchronizing circuit in accordance with claim 8, wherein the phase comparator means includes D-type flip flop circuits having the n kinds of polyphase signals directed to data input terminals of the D-type flip flop circuits and the reception data directed to clock input terminals of the D-type flip flop circuits.

10. A bit synchronizing circuit in accordance with claim 1, wherein the phase comparator means includes D-type flip flop circuits having the n kinds of polyphase signals directed to data input terminals of the D-type flip flop circuits and the reception data directed to clock input terminals of the D-type flip flop circuits.

11. A bit synchronizing circuit in accordance with claim 2, wherein the averaging means calculates a mean value in time of the clock phase information from past to current values in time of the clock phase information.

12. A bit synchronizing circuit in accordance with claim 2, wherein the sampling means includes D-type flip flop circuits having the reception data directed to data input terminals of the D-type flip flop circuits and the n kinds of polyphase signals directed to clock input terminals of the D-type flip flop circuits.

13. A bit synchronizing circuit in accordance with claim 12, wherein the phase comparator means includes D-type flip flop circuits having the n kinds of polyphase signals directed to data input terminals of the D-type flip flop circuits and the reception data directed to clock input terminals of the D-type flip flop circuits.

14. A bit synchronizing circuit in accordance with claim 2, wherein the phase comparator means includes D-type flip flop circuits having the n kinds of polyphase signals directed to data input terminals of the D-type flip flop circuits and the reception data directed to clock input terminals of the D-type flip flop circuits.

* * * * *

UNITED STATES PATENT AND TRADEMARK OFFICE
CERTIFICATE OF CORRECTION

PATENT NO. : 5,909,473
DATED : June 1, 1999
INVENTOR(S) : Yasushi Aoki, et al.

It is certified that error appears in the above-identified patent and that said Letters Patent is hereby corrected as shown below:

Column 1, Line 6: "winch should read --which--
Column 1, Line 25: "Signal" should read --signal--
Column 1, Line 30: "62-3919" should read --62-43919--
Column 1, Line 47: click" should read --clock--

Signed and Sealed this

Twenty-seventh Day of June, 2000

Attest:

Q. TODD DICKINSON

*Attesting Officer*     *Director of Patents and Trademarks*

UNITED STATES PATENT AND TRADEMARK OFFICE
CERTIFICATE OF CORRECTION

PATENT NO. : 5,909,473

DATED : June 1, 1999

INVENTOR(S) : Yasushi Aoki, et al.

It is certified that error appears in the above-identified patent and that said Letters Patent is hereby corrected as shown below:

Column 6, Line 5, Insert the following:

-- Table 1

| Latch output | | | | | | | | Clock phase information 14 | 8-phase clock |
|---|---|---|---|---|---|---|---|---|---|
| 42-1 | 42-2 | 42-3 | 42-4 | 42-5 | 42-6 | 42-7 | 42-8 | | |
| 1 | 1 | 1 | 1 | 0 | 0 | 0 | 0 | 0 (000) | 12-1 |
| 0 | 1 | 1 | 1 | 1 | 0 | 0 | 0 | 1 (001) | 12-2 |
| 0 | 0 | 1 | 1 | 1 | 1 | 0 | 0 | 2 (010) | 12-3 |
| 0 | 0 | 0 | 1 | 1 | 1 | 1 | 0 | 3 (011) | 12-4 |
| 0 | 0 | 0 | 0 | 1 | 1 | 1 | 1 | -4 (100) | 12-5 |
| 1 | 0 | 0 | 0 | 0 | 1 | 1 | 1 | -3 (101) | 12-6 |
| 1 | 1 | 0 | 0 | 0 | 0 | 1 | 1 | -2 (110) | 12-7 |
| 1 | 1 | 1 | 0 | 0 | 0 | 0 | 1 | -1 (111) | 12-8 |

--